US006198766B1

United States Patent
Schuppe et al.

(10) Patent No.: US 6,198,766 B1
(45) Date of Patent: Mar. 6, 2001

(54) METHOD AND APPARATUS FOR ADAPTIVE PRE-DEMODULATION PULSE SHAPING

(75) Inventors: Raymond Walter M. Schuppe, Georgetown; Brian Daniel Varga, Scarborough, both of (CA)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/042,919

(22) Filed: Mar. 17, 1998

(51) Int. Cl.[7] ............................... H03K 7/04; H03K 9/08
(52) U.S. Cl. ..................................... 375/239; 329/312
(58) Field of Search ................................. 375/239, 238; 329/312, 313; 332/109, 112

(56) References Cited

U.S. PATENT DOCUMENTS

| 5,216,238 | 6/1993 | Yoshioka et al. | 250/214 |
| 5,691,665 | 11/1997 | Ohtani | 329/313 |
| 5,844,942 | 12/1998 | Hicks et al. | 375/239 |
| 6,034,802 | 3/2000 | Feng | 359/172 |
| 6,038,049 | 3/2000 | Shimizu et al. | 359/189 |

Primary Examiner—Chi H. Pham
Assistant Examiner—Khai Tran
(74) Attorney, Agent, or Firm—Douglas W. Cameron; Anne Vachon Dougherty

(57) ABSTRACT

One aspect of the invention provides a method of processing an PPM encoded input signal transmission of data pulses to a data processing apparatus by processing the pulses by lengthening or shortening the pulses to a length within the predetermined acceptance pulse duration range of the data processing apparatus comprising: detecting when the input pulses of the input signal fall below the duration required and lengthening the pulses by a sufficient amount to bring them within the predetermined duration; detecting when the input pulses of the input signal exceed the duration required and reducing the duration of the pulses by a sufficient amount to bring them within the predetermined duration. Another aspect of the invention provides an adaptive pulse shaping pre-demodulation device, such as an electronic module, including: an input to accept a series of pulses derived from the reception of a PPM encoded data transmission signal in which the transmission signal includes a data transmission packet; a pulse width comparator to determine whether the pulses of the signal fall within a predetermined acceptance range of duration; a pulse shaping adjuster to modify the duration of the pulses to increase or decrease the duration of the pulses to bring them within the predetermined acceptance range; an output to output the modified pulses for subsequent processing.

5 Claims, 1 Drawing Sheet

METHOD AND APPARATUS FOR ADAPTIVE PRE-DEMODULATION PULSE SHAPING

FIELD OF THE INVENTION

This invention relates to a method and apparatus for improving the communication reliability in high speed optical communication where pulse position modulation (PPM) is used. This has been found to yield particular benefits in the Infrared region of the spectrum now used for wireless communication between data processing devices.

BACKGROUND OF THE INVENTION

Optical communication in the Infrared region of the spectrum has been rapidly gaining ground as an important technique for communicating between data processing devices such as personal computers, printers, and other devices, for instance, in local area networks (LANs). Typically infrared optical transceivers connected to each processing device are used to send and receive data between the data processing devices. Because of the high speed that is desirable for communication between data processing devices, a 4 Mbps (Megabits per second) infrared communications standard using pulse position modulation (PPM) has been proposed by the IRDA Association. This standard, which is described in the Infrared Data Association Serial Infrared Physical Layer Link Specification which is available from the Infrared Data Association, requires very low noise and tight positioning of the pulses within transmissions. In communication between devices that are different distances apart, the portion of the optical transceivers used for receiving the infrared transmissions must be able to effectively handle different levels of signal strength, noise levels, and variation in pulse length or positioning and produce reliably consistent signal outputs. In the typical hardware configuration used to handle infrared transmissions at the present time, the output of the receiving portion of a transceiver is fed to a signal demodulator to decode the data contained within received transmissions. This data is intended to be fed to the data processing device to which it is to be connected.

It has been found that the signal pulses produced from transceiver outputs varied significantly for 4 Mbps PPM data streams. For lower speed communication, eg. under the 1.1 Mbps IRDA standard adopted previously, the effect of this variation has not been as significant due to the greater amount of forgiveness tolerated in the pulse positioning of IR pulses under that earlier standard. For these lower speed transmissions the critical factor was the minimum pulse width required for sufficient noise rejection. The 4 Mbps PPM data streams, on the other hand have very tight positioning requirements and very low noise allowances.

For the IRDA 4 Mbps PPM standard the pulses in a data stream are specified required to be either 125 ns. long or 250 ns. long. The data stream is composed of a number of transmission packets each of which consists of a preamble containing 125 ns pulses and a data portion of 125 or 250 ns pulses. It is important that a device used to process these pulses can distinguish between these two different pulse sizes. Unfortunately we have found that a 125 ns. optical pulse processed by a receiver or receiver portion of a transceiver may produce an electrical output pulse ranging from 20 ns. to 200 ns. in duration and that a 250 ns. optical pulse can produce an electrical pulse from 140 to 320 ns. In a circuit arrangement that we have employed the output of the receiver is decoded by a demodulator to determine the data received. It can be appreciated that there can be difficulties in data recognition if one or more single pulses are received and processed to yield a long pulse or other unanticipated output to be processed by the demodulator. The demodulator may yield an erroneous result.

We have also found that the pulse widths and noise produced by transceiver outputs have varied in response to the following factors:

distance from the transmitter of the optical pulses; ambient noise, variations in the release batches of a transceiver by a manufacturer, or different transceivers by different manufacturers.

It has been found that some transceivers produce output pulses that grow longer when the distance between communicating transceivers is increased, while other transceivers may produce shorter duration pulses, or pulses that increase in duration and then decrease in duration with increasing distance.

The task of designing signal processing circuitry, such as demodulators, that are to be used with Infrared transceivers under the circumstances described above has proven to be quite difficult.

For instance, pulse width acceptance can be set in a demodulation circuit of an IRDA compliant controller, but with the current variation among IRDA transceivers and with new transceivers being developed this could involve designing a specific demodulator circuit for each type or version of a transceiver. This would be very expensive and time consuming. We have also found that when a new IRDA transceiver is actually manufactured and tested, unexpected results are seen in the electrical pulse widths generated.

Accordingly a need therefore exists for compensating for the variations that may occur in the output signal pulses of a transceiver when it is sought to demodulate the signal in a reliable manner, while at the same time not requiring demodulation circuit redesign.

SUMMARY OF THE INVENTION

It has been found that adaptive pre-demodulation pulse shaping of the output signal of a transceiver receiver circuit before passing the output signal to a demodulator provides a significant advance in addressing the problem of pulse variation without the requirement of redesigning demodulators.

An adaptive pulse shaper using adaptive pre-demodulation pulse shaping logic and circuitry is provided by this invention which will decide if a pulse produced by a receiver to be sent to the demodulator should be lengthened (for instance by using an add operation) or shortened (e.g. by using a chop operation). The pulse shaping logic is preferably adapted to use the preamble phase of a 4 Mbps PPM packet to determine the appropriate add or chop level required for the remainder data carrying portion of the packet.

One aspect of the invention provides method of processing an PPM encoded input signal transmission of data pulses to a data processing apparatus by processing the pulses by lengthening or shortening the pulses to a length within the predetermined acceptance pulse duration range of the data processing apparatus comprising:

detecting when the input pulses of the input signal fall below the duration required and lengthening the pulses by a sufficient amount to bring them within the predetermined duration;

detecting when the input pulses of the input signal exceed the duration required and reducing the duration of the pulses by a sufficient amount to bring them within the predetermined duration.

Preferably in this method (as the PPM encoded input signal transmission comprises a packet of data pulses with a preamble portion of a sequence of repetitive pulses of known length and a data portion of data pulses)there is a provision for detecting and identifying a pulse within the preamble portion of the packet, determining whether the duration of the detected preamble pulse lies within the predetermined acceptance pulse duration, if the preamble pulse is shorter than the acceptance duration, determining an add amount to add that is sufficient to bring the pulse duration within the acceptance duration, and adding the add amount to all subsequent data pulses in the packet, and, if the preamble pulse exceeds the predetermined acceptance duration, determining the removal amount to remove that is sufficient to bring the pulse duration within the predetermined acceptance duration, and removing the removal amount from all subsequent data pulses in the packet, and, subsequently outputting the modified pulses to the data processing apparatus.

The encoded input signal may be received from the output of an optical receiving circuit and the modified pulses are transmitted to a PPM demodulator for demodulation.

Another aspect of the invention provides an adaptive pulse shaping pre-demodulation device, such as an electronic module, including an input to accept a series of pulses derived from the reception of a PPM encoded data transmission signal in which the transmission signal includes a data transmission packet;

a pulse width comparator to determine whether the pulses of the signal fall within a predetermined acceptance range of duration;

a pulse shaping adjuster to modify the duration of the pulses to increase or decrease the duration of the pulses to bring them within the predetermined acceptance range;

an output to output the modified pulses for subsequent processing.

In the PPM system of transmission the packet comprises a preamble portion of pulses and a data portion of pulses, including:

a pulse detector to detect the a pulse contained within the preamble of the packet of pulses;

a pulse width comparator to determine whether the detected pulse in the preamble is within the predetermined acceptance range of duration;

a pulse adjuster control to select an amount to add to or subtract from the pulse duration to bring it within the predetermined acceptance range;

a pulse modifier to apply the amount by addition or subtraction as determined previously to subsequent data pulses received within the packet;

an output to output the modified pulses for subsequent processing.

DETAILED DESCRIPTION OF THE INVENTION

Figure 1:
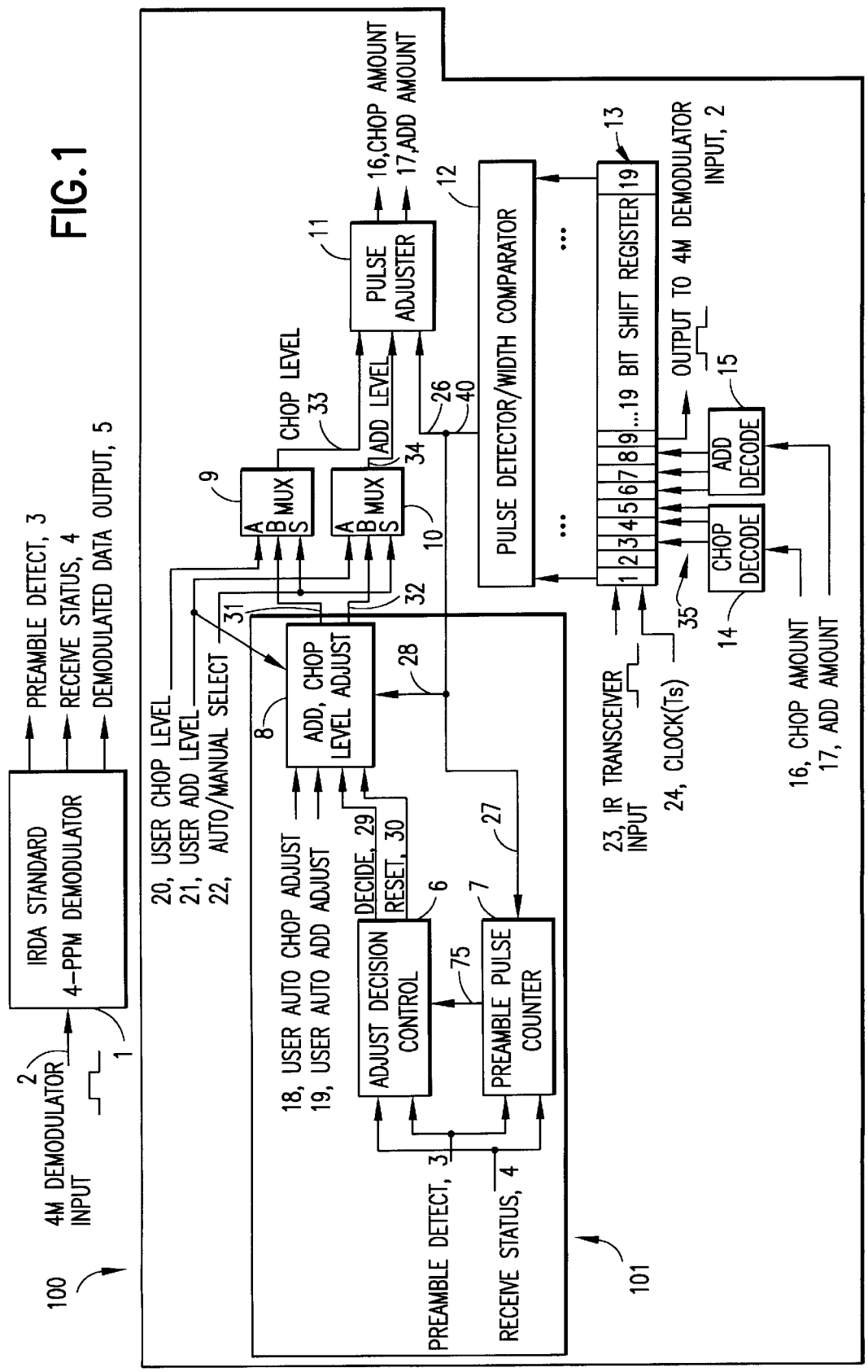
FIG. 1 depicts a high level flow diagram of a logic circuit of a specific embodiment of the invention which can be implemented using ASIC technology as will be readily appreciated from this description.

Under the IRDA 4 Mbps standard the pulses in a compliant data stream are either 125 ns. long (single length pulse) or 250 ns. long (double length pulse). An IRDA compliant demodulator that we have developed, as depicted in FIG. 1, accepts pulses that are between 84 ns and 166 ns in duration as single length (125 ns) pulses and accepts pulses that are between 208 ns and 290 ns in duration as double length (250 ns) pulses.

As demodulators adapted to handle PPM data signals are well known by those skilled in the art we will simplify the discussion of how the demodulator works. A phase lock loop of the demodulator is adapted to synchronize to the preamble of an incoming signal packet in order to extract the frequency of operation and synchronize to it. Once synchronized the demodulator expects data pulses of predetermined length to appear at particular times or slots within a data transmission. These pulses are then demodulated or decoded by the demodulator to identify the data transmitted in the packet.

If pulses generated by a receiver or the receiver portion of a transceiver are not within the above noted ranges then the embodiment of the pulse shaper 100 depicted in FIG. 1 can advantageously be used to modify the pulse duration before demodulation so that the pulses are suitable for reliable processing by the demodulator 1. As will be appreciated by those skilled in the art the invention herein is capable of increasing the acceptance range of a demodulator for output signal pulses received from a receiver thus extending the circumstances under which a chosen demodulator can reliably process incoming signals. This can produce a cost savings in allowing existing demodulators to operate outside their normal acceptance range specifications, avoiding the necessity of redesign or replacement.

The embodiment of the pulse shaper depicted uses adaptive pre-demodulation pulse shaping to decide if a pulse destined for the demodulator 1 should be lengthened by an add operation based on the current add level or shortened by a chop operation based on the current chop level of the pulse shaper, as will become more apparent from the description which follows.

Referring again to FIG. 1 it may be seen that demodulator 1, which in this embodiment is an IRDA standard conforming 4 Mbps PPM demodulator, receives an input signal at input 2 from shift register 13 to which inputs are provided by an infra red (IR) transceiver (not shown) on input 23 and sampling clock input 24. The clock input signal is d derived from a sampling clock (not shown) using a free running oscillator with a 20.83 ns period (Ts) in this embodiment. This period, Ts, was chosen to provide a six times over sampling clock rate relative to the 125 ns pulse width.

The shift register 13 is designed to store and delay the input signal 23 so that it can be measured and modified as described below before being sent to the demodulator 1. The shift register 13 depicted is a 19 bit shift register (i.e.. the shift register is comprised of 19 cascaded registers as indicated by the numbers 1 to 8 ... 19 in the register) which stores receiver output pulses received on input 23 from the IR transceiver when clocked in by the sampling clock input (period Ts) on input 24. In the register depicted the presence of a series of 1's in adjacent registers is proportional to the length of the corresponding input pulse received. Chop Decoder 14, and Add Decoder 15 can (under control of Pulse Adjuster 11) modify the contents of the shift register 12 to alter the length of the stored information by replacing 1's by 0's (clearing bits) or 0's by 1's (setting bits) respectively. As may be seen three inputs, i.e.. to registers 3, 4, 5 are provided by chop decoder 14, while add decoder 15 provides three inputs, i.e.. to registers 6,7, and 8 of register 13. The information stored in the register 13 is shifted out to the demodulator 1 from the 9th register, after having been modifi.e.d by decoders 14, or 15 as required. As depicted in FIG. 1 the decoders 14, and 15 are operative on the tail ends of stored pulses in registers 3 to 8, either shortening or lengthening the stored pulses respectively as required.

Each of the registers (1 to 19) in shift register 13 is linked to the Pulse Detector/Width Comparator 12 which compares the contents of the registers with a preset array of bit patterns which correspond to the normal acceptance range of the demodulator 1 for single and double pulses. Definitions of the maximum limits, minimum limits, and nominal pulse widths for single and double pulses for the demodulator are listed below in the pseudo code as referenced to multiples of the sampling clock period Ts. Generally speaking the comparator operates as follows:

If a stored pulse falls within the acceptance range of the demodulator the comparator will produce control signals 26 to the Pulse Adjuster 11 which will not require the clearing or setting of bits in the shift register 13 by decoders 14, 15. However, if a stored pulse falls outside the acceptance range of the demodulator then the comparator 12 will output a difference (delta) value to the Pulse Adjuster 11 causing it to output a Chop amount 16, or Add amount 17 to Chop Decoder 14, or Add Decoder 15 respectively, as required to attempt to bring the stored pulse just within the acceptance range of the demodulator. For instance, if the stored pulse is 3 Ts in length the comparator would determine that it is 1 Ts short of the minimum required by the demodulator for a single pulse and would signal Pulse Adjuster 11 to cause the Add Decoder 15 to add 1 Ts to the length of the stored pulse. Conversely if a stored pulse exceeds the maximum length required by the demodulator then the comparator will signal the Adjuster 11 to cause the chop decoder 14 to clear bits from shift register. In the case of a double pulse being stored as a 15 Ts width pulse then 1 Ts length would be removed.

The maximum amount of chop or add that can be set by the chop decoder 14, or add decoder 15 respectively is set by the output levels of Mux 9, and 10 respectively to the pulse adjuster 11, so that pulse adjuster can be controlled by the comparator 12 to select between 0 and 3 levels (i.e.. 0 to 3Ts).

The maximum levels of chop and add that can be appli.e.d by Mux 9, or 10 under manual mode of operation of the pulse shaper of the invention are respectively set by the system designer at setup time for the pulse shaper using inputs 20, and 21. If manual operation is desired by the system designer this can be selected from input 22 to the muxes 9, 10.

We have found it useful to provide 3 levels of add and chop operations in incremental steps of 20.83 ns in length. For instance, an Add level of 1 will lengthen borderline pulses by 20.83 ns to meet the demodulator's minimum pulse requirements of 84 ns for a single pulse or 208 ns for a double pulse. In contrast, a Chop level of 2 will shorten borderline pulses by twice 20.83, i.e. 41.67 ns to meet the demodulator's maximum pulse requirements (166 ns for a single pulse or 290 ns for a double pulse).

The following summary illustrates how the different levels affect the pulse duration minimums and maximums.

| | | | |
|---|---|---|---|
| Add level 1 | single pulse minimum 62.5 ns | double pulse minimum 187 ns |
| Add level 2 | single pulse minimum 41.7 ns | double pulse minimum 167 ns |

-continued

| | | | |
|---|---|---|---|
| Add level 3 | single pulse minimum 20.9 ns | double pulse minimum 145 ns |
| Chop level 1 | single pulse maximum 187 ns | double pulse maximum 312 ns |
| Chop level 2 | single pulse maximum 208 ns | double pulse maximum 333 ns |
| Chop level 3 | single pulse maximum 229 ns | double pulse maximum 354 ns |

It is understood that some combinations of add and chop level may have conflicting results. For example, using a Chop level 2 with an Add level 1 would specify a single pulse maximum of 208 ns with a double pulse minimum of 187 ns. The arbitration of such conflicts may vary for different implementations of the invention. However, the setting of conflicting add and chop levels is normally not expected and would be simple to avoid by a person skilled in the art by following this description. Normally either an add or a chop level is selected at one time, not both, since it is expected that single and double pulses will either be shortened or lengthened by similar amounts by a selected transceiver.

Adaptive Controller Section

The adaptive controller section 101 of the pulse shaper can be considered to include the preamble pulse counter 7, the adjust decision control 6 and the add, chop level adjust logic 8 which provide an appropriate chop or add level to the pulse adjuster for adaptively adjusting data received by the shift register 13 and ultimately provided to the demodulator.

When data is transmitted in accordance with the IRDA 4 Mbps PPM standard a seri.e.s of data packets are transmitted. Each of these data packets includes a preamble phase which comprises the first part of the packet. The preamble contains a seri.e.s of 64 optical pulses of 125 ns duration. There are no 250 ns pulses present in the preamble.

As only 125 ns pulses are present in the preamble the adaptive pre-demodulation pulse shaping logic of the embodiment can examine the preamble pulses to determine the appropriate add or chop level to apply to pulses in the remainder of the packet received from the transceiver before sending them for demodulation by the demodulator.

Default levels of the add and chop levels 34, 33 respectively are provided by the add, chop level adjust block 8 prior to making an adaptive decision for instance prior to any signal being received or in the initial process of receiving a preamble. In the implementation depicted the initial chop level is set to 3 Ts, and the initial Add level (the absolute maximum add level) is set to the user add level which has been preselected by the system designer and which may range from 0 to 3 Ts in our implementation. The absolute maximum add level determines how narrow a preamble pulse may be and still be recognized while excluding noise. This absolute maximum add level can be determined by the system designer considering the noise response characteristics of the receiver intended for use. The absolute maximum add level is required because it sets the noise immunity for the preamble phase and the subsequent data portion of the transmission packet.

For the most flexible operation of the embodiment of the invention automatic mode may be selected by the system designer using input 22 to the muxes 9, and 10. When in automatic mode the pulse detector/comparator 12 is used to determine the pulse length of the pulses in the preamble of an incoming data transmission packet and set the adjustment output of the pulse adjuster 11 to an amount that will cause the chop or add decoders 14, 15 respectively to decrease or increase the subsequent data portions of the data transmission packet that are stored and shifted through shift register 13. The pseudocode listing below describes a preferred method of implementation of automatic operation.

If the preamble of a transmission packet is being received by the pulse shaper as passed through to the demodulator then the receive status output 4 and the preamble detect output 3 of the demodulator 1 will go active enabling the preamble of a packet to be identifi.e.d by the pulse shaper. In this situation the preamble pulse counter 7 is enabled and starts counting pulses in the preamble, feeding its count level to input 75 of the adjust decision control which has been similarly enabled by outputs 3, and 4 of the demodulator.

When the counter 7 reaches count 25 which has been chosen as it corresponds to a position close to the middle of the preamble pulse stream then the adjust decision control logic 6 issues a decide output command 29 to the add, chop level adjust logic 8 which uses the output 28 of the pulse detector width comparator 12 and the user auto chop adjust parameter setting 18, and user auto add adjust parameter setting 19 (both selected by the system designer) to set the chop level 33 from Mux 9 or the add level 34 from mux 10 such that in the embodiment depicted the automatic add level is adjusted so that the minimum single pulse width will be either 1 Ts or 2 Ts in duration (20.83 or 41.7 ns respectively) less than the preamble sample, but never less than an absolute minimum pulse width (determined by the absolute maximum add level) and not greater than 4 Ts (84 ns) (in which case the Add level is not selected or is disabled). The adjustment of 1 Ts or 2 Ts (20.8 or 41.7 ns respectively) is set in the user auto add adjust register.

The automatic chop level is adjusted so the maximum single pulse is either 1 Ts, 2 Ts, or 3 Ts (20.8, 41.7, or 62.5 ns respectively) greater than the preamble pulse sample, but not less than 8 Ts (166 ns. the single pulse maximum acceptance limit of the demodulator) (At 8 Ts the Chop level is not selected or is disabled). This adjustment (20.8, 41.7, or 62.5 ns) is set in the auto chop adjust register.

With these constraints in consideration it can be understood that when a preamble sample is processed by the embodiment of the invention described that either a chop or an add level can be active at one time, but not both.

With this dynamic adjustment of pulse widths the add and chop levels are adjusted automatically on a packet by packet basis. The automatic adjustment of the add level is controlled independently from the automatic adjust of the chop level. Both automatic adjustments use the same pulse measurement in the preamble to set the appropriate levels.

Demodulator Requirements

For automatic operation using the adaptive pre-demodulation pulse shaping logic of the invention two feedback signals are required from the Demodulator 1, an Idle signal (provided in this illustration by Receive Status going inactive), and a Preamble sequence detection signal 4.

The Idle signal indicates that the demodulator is IDLE and not receiving anything. This is used to deactivate adding operations to prevent the generation of double pulses. A packet cannot be started with double pulses. The Idle signal is also used to reset the add level to the absolute maximum add level.

The Preamble sequence detection signal 3 indicates that the demodulator is detecting the preamble sequence of a data packet. This signal informs the adaptive pre-demodulation pulse shaping logic of the embodiment of the invention depicted that a preamble sequence has been detected, and that a pulse sample or samples should be made. For the purposes of simplicity the logic 101 is adapted to take one sample 25 pulses after the preamble is first detected by the demodulator 1. Since the preamble is detected usually within the first 5 to 10 pulses in the demodulator the actual pulse sampled will around pulse 30 to 35 of the preamble stream. A more sophisticated sampling scheme could be used to identify a preamble pulse but was not found to be necessary in this implementation. As will be recognized by those skilled in the infrared data communication art adaptive pre-demodulation pulse shaping as described can be appli.e.d to existing 4 Mbps PPM demodulators with some minor adjustments to conform to the particular demodulator's minimum and maximum pulse acceptance requirements and preamble detection capability.

Pseudocode

The following section depicts pseudocode of an embodiment of the invention which can be used in the implementation of the invention in the embodiment depicted in FIG. 1 as described above.

Adaptive Pre-demodulation Pulse Shaping Pseudo Code
/*Sample Time definition*/
Ts=20.83 nS;
/*User Selectable Definitions*/
User_Chop_level=0Ts to 3Ts;
User_Add_level=0Ts to 3Ts;
User_AutoChop_adjust=1Ts to 3Ts; /*Maximum pulse width above preamble*/
User_AutoAdd_adjust=1Ts to 2Ts; /*Minimum pulse width less than preamble*/
/* Pulse Detector/Width Comparator Operation */
/* Shift register shifts and samples output from IR Receiver, every Ts*/
Pulse_width=Output of Shift Register and Pulse Detector;
/* 4 Pulse Position Modulation (4-PPM) Pulse Width Definitions*/
/* The values are the pulse decoding limits of the PPM demodulator */
Single_Min=4Ts; (83 nS)
Single_Nominal=6Ts; (125 nS)
Single_Max=8Ts; (166 nS)
Double_Max=14Ts; (290 nS)
Double_Nominal=12Ts; (250 nS)
Double_Min=10Ts; (208 nS)
BEGIN
Do (forever)
{
  IF (sample-time_event==TRUE /*every Ts*/)
  {
/* Serial load the serial/parallel loading shift register */
    Shift_register_input=Input_signal_value; /* Input signal is the IR receiver's output */
    Shift_register=Shift (Shift_register); /* The shift registers contents get shifted by one position*/
/* Check for a pulse width of at least Single_Min for the preamble counter*/
/*Preamble_Pulse_Detect is set to true when a pulse meeting the Single_Min criteria is found*/
/* This gets measured after shift register is modified by add operation as described below */
/*This allows pulses that are less than the Single_Min length to get adjusted by the add circuit and detected as preamble pulses*/
Preamble_Pulse_Detect=Edge2Single_min_pattern_compare (Shift_register);
/* Detect transition points for pulse detection and width measurement */
/* Any given pulse will only be detected once */
    Pulse_detected=DualEdgeDetector (Shift_register);

```
IF Pulse_detected==TRUE
{
    Pulse_width=Edge2Edge_Measure(Shift_register);
/* Pulse Width Comparator Operation */
/* Determine how too much short the single or double pulse
is */
/* Deltas are constrained between 0 and 3Ts */
/* If over Single_nominal, then consider a double pulse for
add*/
    IF (Pulse_width<Single_Nominal)
    {
        Short_delta=(Single_min-pulse_width), Min=0Ts,
            Max=3Ts;
    }
    ELSE
    {
        Short_delta=(Double_min-pulse_width), Min=0Ts,
            Max=3Ts;
    }
/* Determine how too much long a single or double pulse is
*/
/* Deltas are constrained between 0 and 3Ts */
/* If under Double_nominal, then consider a single pulse for
chop*/
    IF (Pulse_width<Double_Nominal)
    {
        Extend_delta=(Pulse_width-Single_Max), Min=
            0Ts, Max=3Ts
    }
    ELSE
    {
        Extend_delta=(Pulse_width-Double_Max), Min=
            0Ts, Max=3Ts
    }
/* Pulse Adjuster, Add and Chop Decoder Operation*/
/* If a pulse is too short, set extra bits in the shift register */
/* This will lengthen the pulse by Num_bits_to_set Ts */
    Num_bits_to_set=Min(Short_delta, Add_level);
    Shift_register=Setbits(Shift_register, Num_bits_to_
        set);
/* If a pulse is too long, clear bits in the shift register */
/* This will shorten the pulse by Num_bits_to_clear Ts */
    Num_bits_to_clear=Min(Extended_difference, Chop_
        level);
    Shift_register=Clearbits(Shift_register, Num_bits_to_
        clear);
} /* end IF pulse_detected==TRUE*/
/*********************************************
*************/Non Adaptive Chop and Add Levels
If (Adaptive_mode==FALSE)
{
    Chop_level=User_chop_level;
    Add_level=User_add_level;
}
/* Adaptive Operation for Automatic Setting of Add and
Chop Levels*/
    Else
    {
        If (Receive_Status==IDLE)/* Reset to default chop
            alnd add levels */
        { /* when not receiving a carri.e.r */
            Chop_level=3Ts;
            Add_level=User_add_level;
            Pulse_Count=0;
            Adjust_Decide_Reset=TRUE;
            Decide=FALSE;
        }
        /* Act on pulses in the preamble phase */
        If ((Preamble_Detected==TRUE) AND (Preamble_
            Pulse_Detect==TRUE))
        {
            Adjust Decide_Reset=FALSE;
            If (Pulse_Count=24 AND Decide=FALSE) /*Decision
                time */
            {
                Decide=TRUE;
/* Auto Chop and Add Level Adjust */
/* Set chop level */
                If (Pulse_Width>(Single_Max-User_Autochop_
                    adjust))
                Chop_Level=(Pulse_Width-Single_Max)+User_
                    Autochop_Adjust, Max=3Ts;
/* Set add level */
                If (Pulse_Width<(Single_Min+User_AutoAdd_
                    adjust))
                Add_Level=(Single_Min-Pulse_Width)+User_
                    AutoAdd_Adjust, Max=3Ts;
            }
/* Preamble Pulse Counter */
            Else
            {
                Pulse_Count=Pulse-Count+1;
            }
        } /* end IF preamble_detected */
    } /* end IF Adaptive_mode */
} /* end IF sample_time_event==TRUE */
} /* Do forever */
```

The embodiments of the invention in which an exclusive property or privilege is claimed are defined as follows:

1. A method of processing an PPM encoded input signal transmission of data pulses to a data processing apparatus by processing said pulses by lengthening or shortening the pulses to a length within the predetermined acceptance pulse duration range of said data processing apparatus comprising:

detecting when the input pulses of said input signal fall below the duration required and lengthening said pulses by a sufficient amount to bring them within said predetermined duration;

detecting when the input pulses of said input signal exceed the duration required and reducing the duration of said pulses by a sufficient amount to bring them within said predetermined duration.

2. The method of claim 1 wherein said PPM encoded input signal transmission comprises a packet of data pulses which packet includes a preamble portion of a sequence of repetitive pulses of known length and a data portion of data pulses, and in which said method comprises:

detecting and identifying a pulse within the preamble portion of said packet, determining whether the duration of said detected preamble pulse lies within said predetermined acceptance pulse duration, if said preamble pulse is shorter than said acceptance duration, determining an add amount to add that is sufficient to bring said pulse duration within said acceptance duration, and adding said add amount to all subsequent data pulses in said packet, and, if said preamble pulse exceeds said predetermined acceptance duration, determining the removal amount to remove that is sufficient to bring said pulse duration within said predetermined acceptance duration, and removing said removal amount from all subsequent data pulses in said packet, and, subsequently transmitting said modified pulses to said data processing apparatus.

3. The method of claim 2 wherein said encoded input signal is received from the output of an optical receiving circuit and said modified pulses are transmitted to data processing apparatus comprising a PPM demodulator.

4. Adaptive pulse shaping pre-demodulation apparatus comprising:

pulse receipt means to accept a series of pulses derived from the reception of a PPM encoded data transmission signal wherein said transmission signal includes a data transmission packet;

comparator means to determine whether said pulses of said signal fall within a predetermined acceptance range of duration;

pulse adjuster means to modify the duration of said pulses to increase or decrease the duration of said pulses to bring them within said predetermined acceptance range by modification of the contents of said pulse receipt means to produce modified pulses; and means to output said modified pulses for subsequent processing.

5. The apparatus of claim 4, wherein said packet comprises a preamble portion of pulses and a data portion of pulses, comprising:

means to detect the length of a pulse contained within the preamble of said packet of pulses;

means to determine whether said detected pulse in said preamble is within said predetermined acceptance range of duration;

means to select an amount to add to or subtract from said pulse duration to bring it within said predetermined acceptance range;

means to apply said amount by addition or subtraction as determined previously to subsequent data pulses received within said packet;

means to output said modified pulses for subsequent processing.

* * * * *